United States Patent [19]

Carson et al.

[11] Patent Number: 5,293,382
[45] Date of Patent: Mar. 8, 1994

[54] METHOD FOR FDMA SIGNAL MULTIPLEXING AND DEMULTIPLEXING

[75] Inventors: Lansing M. Carson, Chandler; Robert J. Burdge, Mesa, both of Ariz.

[73] Assignee: Motorola, Inc., Schaumburg, Ill.

[21] Appl. No.: 24,032

[22] Filed: Mar. 1, 1993

[51] Int. Cl.$^5$ ............................................... H04J 1/05
[52] U.S. Cl. ...................................... 370/123; 370/70; 364/724.13; 364/726
[58] Field of Search ......................... 370/69.1, 123, 70; 364/724.13, 724.16, 725, 726

[56] References Cited

U.S. PATENT DOCUMENTS

| | | | |
|---|---|---|---|
| 4,107,470 | 8/1978 | Maruta | 364/726 |
| 4,300,229 | 11/1981 | Hirosaki | 370/70 |
| 4,792,943 | 12/1988 | Guml/o/ckler | 370/70 |

OTHER PUBLICATIONS

An article entitled "Multirate Digital Signal Processing" by R. E. Crochiere et al, AT&T Acoustics Research Department, Bell Laboratories, Murray Hill, N.J., Prentice-Hall, Inc., Englewood Cliffs, N.J. 07632, pp. 289–310 and 356–376. 1983.

*Primary Examiner*—Douglas W. Olms
*Assistant Examiner*—Min Jung
*Attorney, Agent, or Firm*—Jeffrey D. Nehr

[57] ABSTRACT

A method for multiplexing a series of frequency division multiple access (FDMA) signals includes providing complex channels offset relative to the FDMA signals. Each FDMA signal is filtered to be centered and occupy one-half of the bandwidth of each complex channel, leaving an "off" channel between each pair of successive FDMA signals. The real part of the multiplexed output signal is processed and higher frequency signals of FDMA signals image into the "off" channels. Demultiplexing includes aligning a demultiplexing channelization pattern with the multiplexed input signal contained in input channels. The input channels are one-half a bandwidth of each of the complex channels. The input channels contain a sequence of FDMA signals separated by a reverse sequence of images of the FDMA signals. Consecutive even-numbered input channels correspond to consecutive complex channels of the complex channels and the sequence of FDMA signals can be extracted from the complex channels.

20 Claims, 4 Drawing Sheets

METHOD FOR FDMA SIGNAL MULTIPLEXING AND DEMULTIPLEXING

FIELD OF THE INVENTION

This invention relates in general to methods for digital filter bank analysis and synthesis and in particular to the methods for multiplexing and demultiplexing of frequency division multiple access (FDMA) signals.

BACKGROUND OF THE INVENTION

Digital filter bank and spectrum analysis and synthesis are extremely important in a variety of fields, including voice and data communication. The IRIDIUM TM Satellite Cellular Communications System, for example, calls for use of an L-band modem link using a 24-channel frequency division multiple access (FDMA) signal. The FDMA signal must be channelized to provide for proper interfacing to single-channel modulators and demodulators. At the transmitter, the baseband signals must be filtered and translated to the appropriate frequencies for summation into an overall FDMA signal (i.e., multiplexed). In the receiver, the various channels of the FDMA input signal must be separated by filtering and translated to baseband (i.e., demultiplexed) for input to a bank of demodulators.

Taking a brute force approach to generating and separating FDMA signals requires a channel filter and local oscillator for each FDMA channel. This approach, however, results in a large size and weight for a large number of channels, which is intolerable for a space-borne system.

Various techniques have been described for digital filter bank and spectrum analysis and synthesis. The text *Multirate Digital Signal Processing*, by Ronald E. Crochiere and Lawrence R. Rabiner, published in 1983 by Prentice-Hall, Inc., Englewood Cliffs, N.J., develops such techniques for several cases, including a complex filter bank and single-sideband filter bank. The Crochiere and Rabiner technique is not applied to teach a hardware-efficient method for generating and separating FDMA signals, however, such as are required for the IRIDIUM TM System.

Thus, what is needed is a method for FDMA signal multiplexing and demultiplexing which reduces filter computation and storage requirements, frequency translation computations, and minimizes size and weight. Specifically, the method should allow the transmission and reception of real signals while manipulating complex baseband signals (I and Q data of a quadrature phase shift key (QPSK) signal).

SUMMARY OF THE INVENTION

Accordingly, it is an advantage of the present invention to provide a new and improved method for FDMA signal multiplexing and demultiplexing. It is a further advantage of the present invention to provide such a method to reduce filter computation, storage requirements, and frequency translation computations. It is still a further advantage of the present invention to be conductive to a hardware implementation to minimize size and weight.

To achieve these advantages, a method for multiplexing a series of frequency division multiple access (FDMA) signals to produce a multiplexed output signal is contemplated which includes the steps of providing a plurality of complex channels corresponding to the series of FDMA signals. Each of the series of FDMA signals is offset relative to each of the plurality of complex channels. Each of the series of FDMA signals is filtered to be centered within and occupy one-half of an available bandwidth of each of the plurality of complex channels, leaving a series of "off" channels between each pair of successive FDMA signals. The real part of the multiplexed output signal is processed such that a plurality of higher frequency signals of the series of FDMA signals image into the series of "off" channels.

The method for demultiplexing a multiplexed input signal into a sequence of frequency division multiple access (FDMA) signals includes the step of providing a demultiplexing channelization pattern comprising a plurality of complex channels in a complex channel spectrum. The multiplexed input signal contained in a plurality of input channels is aligned with the demultiplexing channelization pattern, wherein each of the plurality of input channels are one-half a bandwidth of each of the plurality of complex channels. The plurality of input channels contain a sequence of FDMA signals separated by a reverse sequence of images of the FDMA signals. The plurality of input channels is overlaid onto the plurality of complex channels such that consecutive even-numbered input channels correspond to consecutive complex channels of the plurality of complex channels and the sequence of FDMA signals can be extracted from the plurality of complex channels.

The above and other features and advantages of the present invention will be better understood from the following detailed description taken in conjunction with the accompanying drawings.

DETAILED DESCRIPTION OF THE PRIOR ART

Figure 1:
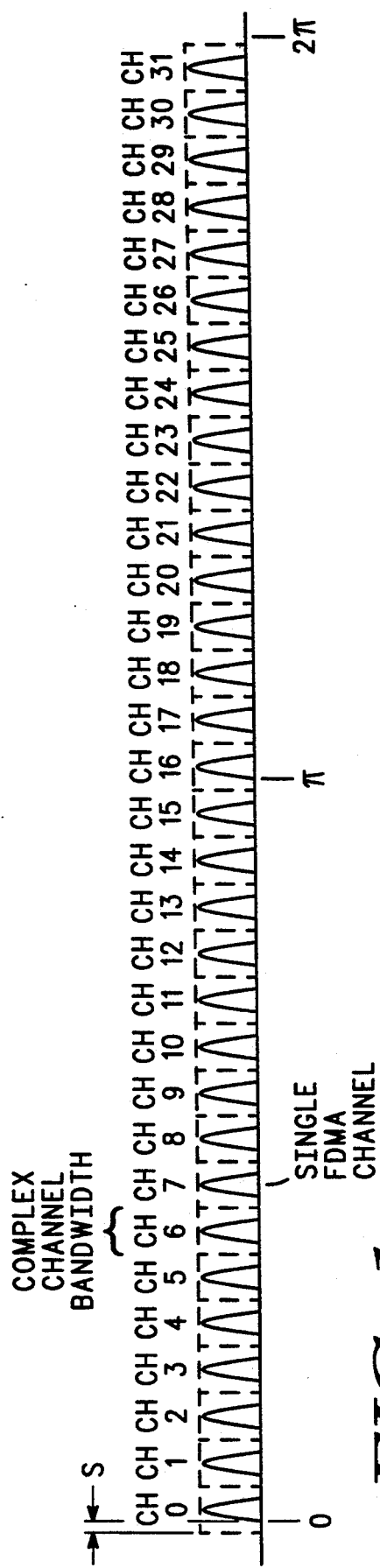
In FIG. 1, there is shown a diagram of a complex output spectrum from an FDMA synthesizer (multiplexer).

The text *Multirate Digital Signal Processing*, by Ronald E. Crochiere and Lawrence R. Rabiner, referred to above and herein incorporated by reference, provides a useful framework and notation for mathematically describing the present method for multiplexing and demultiplexing.

Standard decimator and interpolator structures, using a direct structure and employing a low pass filter, are not efficient because a portion of the decimator output values are ignored and a portion of the interpolator calculations involve multiplication by zero. A more efficient method uses a polyphase network structure in which an original filter response has been apportioned equally across branches to create various branch filters. That is, where N is the total number of coefficients in the prototype filter and M is the interpolation or decimation factor, each branch has N/M coefficients.

The equations describing the input and output relationships of a conventional multiplexer/demultiplexer operation are:

$$x(n) = \frac{1}{K} \sum_{k=0}^{K-1} W_K^{kn} \sum_{m=-\infty}^{\infty} X_k(m) f(n - mM) \qquad \text{Equation 1}$$

$$X_k(m) = \sum_{n=-\infty}^{\infty} h(mM - n)x(n) W_K^{-kn} \qquad \text{Equation 2}$$

where x is the input signal, n is dependent on the sampling process, K is the number of channels, k=0,1, ... , K−1 and denotes the signal channels, $X_k$ denotes the kth channel signal, f is a synthesis (multiplexing) filter function, M is a sampling rate reduction factor, and $W_k$ is $e^{2\pi j/k}$.

The polyphase structure described above is described by the following equations:

$$X_k(m) = \sum_{p=0}^{M-1} W^{-kp} \sum_{r=-\infty}^{\infty} \overline{p_p}(r)\overline{x_p}(m - r) \qquad \text{Equation 3}$$

$$\overline{p_p}(n) = h(nM - p) \qquad \text{Equation 4}$$

$$\overline{x_p}(n) = x(nM + p) \qquad \text{Equation 5}$$

$$\hat{x}_p(r) = \sum_{m=-\infty}^{\infty} q_p(r - m) \left[ \frac{1}{M} \sum_{k=0}^{M-1} \hat{X}_k(m) W_M^{kp} \right] \qquad \text{Equation 6}$$

$$q_p(m) = f(mM + p) \qquad \text{Equation 7}$$

$$\hat{x}_p(r) = \hat{x}(rM + p) \qquad \text{Equation 8}$$

where $p=0, 1, 2, \ldots, M-1$

The overbar notation indicates a clockwise commutator implementation versus a counterclockwise implementation. $x_p$ with the "hat" represents the polyphase output signals, $q_p$ and $p_p$ are the polyphase branches for the bandpass filters, $\hat{X}_k$ are the input signals in the synthesizer (i.e., multiplexer) and $W_M = e^{2\pi j/M}$.

Both equations 3 and 6 include an operation in the form of a Discrete Fourier Transform (DFT). Examination of equations 3 and 6 also reveals that the total number of filter calculations required for the polyphase multiplexer/demultiplexer has been reduced by M.

DETAILED DESCRIPTION OF THE PREFERRED EMBODIMENT

The actual implementation of the polyphase multiplexing and demultiplexing method for the IRIDIUM TM System involves an FDMA signal format of 32 channels. Only the middle 24 channels are used, however, due to Intermediate Frequency (IF) filter attenuation present in the analog portion of the transceiver. In the multiplexer, it was desired to generate 32 real channels within the allowable bandwidth (0 to $\pi$, normalized, for a real signal).

The multiplexing/demultiplexing method described assumes complex channels, in which the normalized bandwidth encompasses 0 to $2\pi$. But when the real part of the signal is extracted for transmission, the frequencies from $\pi$ to $2\pi$ will alias into the band from 0 to $\pi$. Therefore, it was required to generate 32 complex channels in such a way so that when the real part of the signal was taken, 32 unique real channels would result.

In FIG. 1, there is shown a complex output spectrum from a multiplexer operating in accordance with the method described herein. Within the spectrum of 0 to $2\pi$, 32 adjacent complex channels, labelled Ch. 0, Ch. 1, ..., Ch. 31, are defined. It can be seen that the channels are defined with a one-fourth channel offset, s, of the complex channel edge with respect to 0 (i.e., an even stacking scheme). This offset is critical to generating unique channels. Because of this frequency offset, the equations describing the multiplexer and demultiplexer operation exhibit the form of a Generalized Discrete Fourier Transform (GDFT), as will be seen below.

Also shown in FIG. 1 are 32 individual single FDMA channels within each complex channel, and the signal waveforms associated with each signal FDMA channel. Only half of the available bandwidth of each complex channel is used by the individual FDMA channels, which is controlled by the response of the filters used. Each of the individual FDMA channels is centered within its corresponding complex channel. This creates what are essentially "off" channels in between successive complex channels. The "off" channels are of the same bandwidth as the single FDMA channels and separate successive single FDMA channels. When the real part of the output signal is taken, the higher frequency channels "fold back" in and fill in these "off" channels, creating 32 real contiguous channels in the region from 0 to $\pi$, as shown in FIG. 2.

Figure 2:
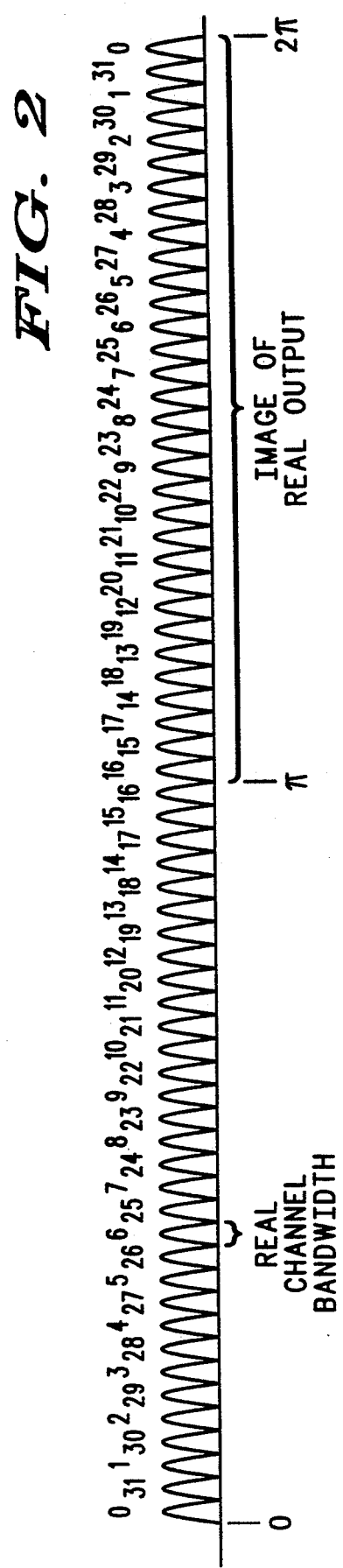
In FIG. 2, there is shown a diagram of a real output spectrum from an FDMA multiplexer.

In FIG. 2, there is shown the real output spectrum using a multiplexing method in accordance with the present invention. The individual FDMA signals originally present in the 32 complex channels of FIG. 1 remain in FIG. 2. However, because of the aliasing and imaging of the FDMA channel signals symmetrically about the point $\pi$ on the spectrum when the real part of the output spectrum is taken, individual FDMA channel signals occur a second time in the spectrum. The choice of the quarter complex channel offset described above results in the images of the individual FDMA channel signals occurring exactly between each of the original FDMA channel signals, without overlap, in the previous "off" channels.

In FIG. 2, the individual FDMA channel signal labelled with channel number 0 in FIG. 2 occurs both immediately to the right of 0 and immediately to the left of $2\pi$ in the spectrum. Moving to the right along the channel spectrum in FIG. 2, in the previously "off" channel between original FDMA channel signals 0 and 1, the image of channel signal 31 occurs. Similarly, in the previously "off" channel between original channel signals 1 and 2, the image of channel signal 30 occurs, and so on. The aliasing and imaging creates a symmetric individual FDMA signal spectrum with respect to the point $\pi$ on the spectrum when the real part of the output signal is taken. The real output spectrum from 0 to $\pi$ is repeated in the image of the real output from $\pi$ to $2\pi$.

Figure 3:
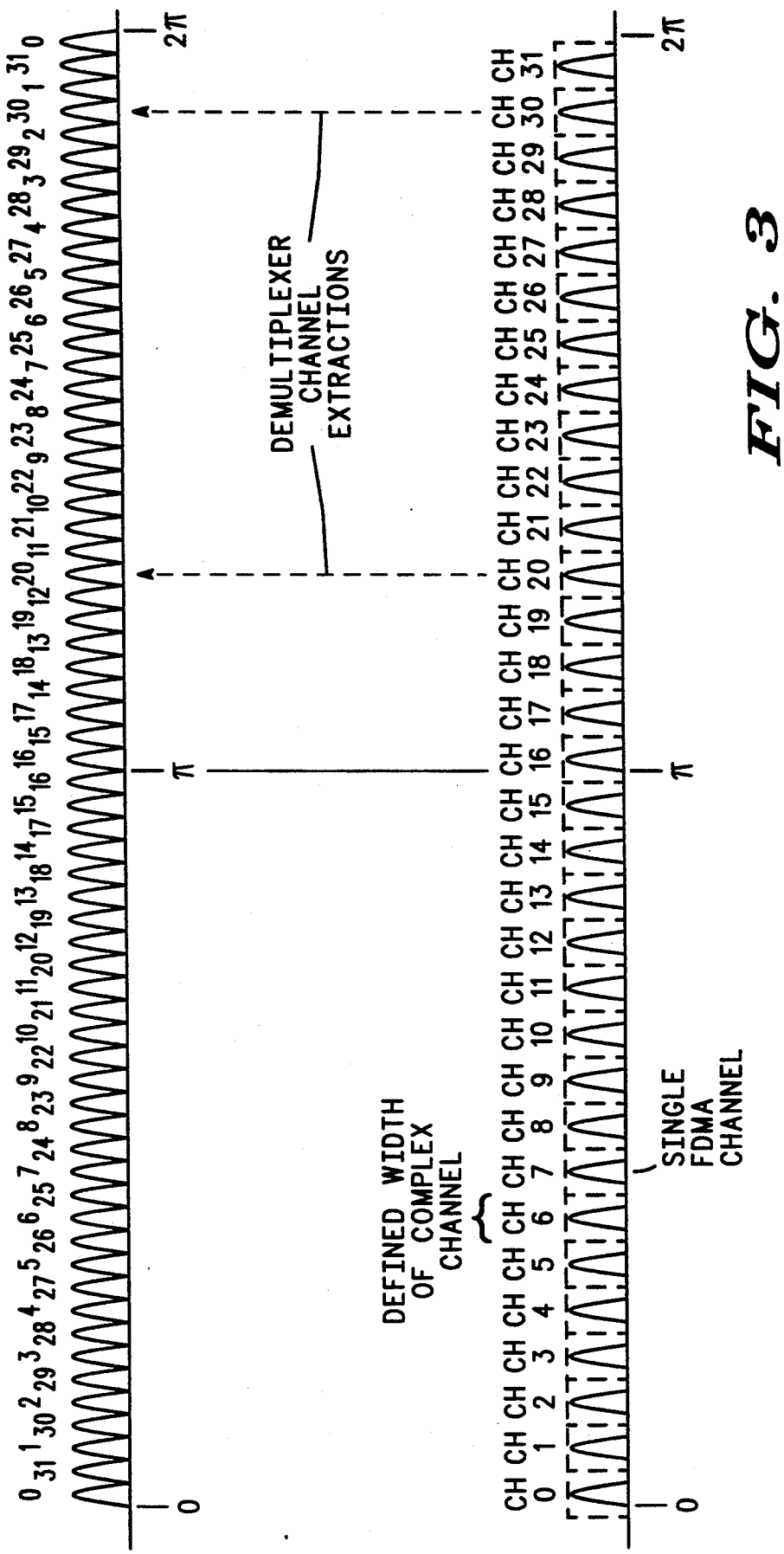
In FIG. 3, there is shown a diagram of analyzer (demultiplexer) channel extractions from a real input spectrum.

In FIG. 3, there is shown a diagram of analyzer (demultiplexer) channel extractions from a real input spectrum. The upper portion of FIG. 3 shows the real output spectrum and image of the real output spectrum from FIG. 2. The lower portion of FIG. 3 illustrates the complex channels which correspond to the real output spectrum and image of the real output spectrum channels of FIG. 2. The length along the normalized spectrum between successive dashed vertical lines in the lower portion indicates the defined width of each complex channel making up the demultiplexer. The complex channel width is twice the width of each individual FDMA channel from the real output and image of the real output in the upper portion of FIG. 3. The complex channel width is offset one-quarter channel, as was the case in the multiplexer of FIG. 1, so that each single FDMA channel is centered within its corresponding complex channel. The channel 0 FDMA signal thus starts at 0 on the demultiplexer spectrum.

The demultiplexer channel extractions shown in the lower portion of FIG. 3 correspond to every other FDMA channel signal from the upper portion of FIG. 3. When the actual input channels are overlaid on the demultiplexer channelization pattern, the demultiplexer "skips" the odd channels and captures only the even channels in the region from 0 to $\pi$. The odd channels are not lost, however, since the demultiplexer will actually capture the images of the odd channels in the region from $\pi$ to $2\pi$.

As an example, channels 20 and 30 in extracted form at the lower portion of FIG. 3 are shown as corresponding to the FDMA channel signals 20 and 30, respectively, of the image of the real signal at the top of FIG. 3. The demultiplexer extractions of the FDMA channel signals 0 through 16 occur from the FDMA channel real signal (the 0 to $\pi$ portion of the upper spectrum in FIG. 3). The demultiplier extractions of the FDMA channel signals corresponding to FDMA channel signals 17 through 31 come from the image of the real FDMA signals (the $\pi$ to $2\pi$ portion of the upper spectrum of FIG. 3).

Modifying the multiplexer and demultiplexer equations to reflect the above described method including changes in channel stacking and translation from complex to real signals leads to the following equations:

$$\hat{x}_p(m) = \text{Equation 9}$$

$$Re\left[\sum_{r=-\infty}^{\infty} q_p(m-r)j^{m-r}\left(W_M^{p/4} \frac{1}{M} \sum_{k=0}^{M-1} \hat{X}_k^{GDFT}(r)^r W_M^{kp}\right)\right]$$

where $\hat{X}_k^{GDFT}$ is the kth channel signal in the synthesizer (multiplexer) and $p=0, 1, \ldots, M-1$. Also, $$X_k^{GDFT} = j^{-m} \sum_{p=0}^{M-1} W_M^{-kp}\left(W_M^{-p/4} \sum_{r=-\infty}^{\infty} \overline{x}_p(m-r)(\overline{p}_p(r)^r)\right) \quad \text{Equation 10}$$

for $k=0, 1, \ldots, M-1$. The DFT operation in both equations contains a one-quarter channel frequency offset yielding a GDFT form.

Figure 4:
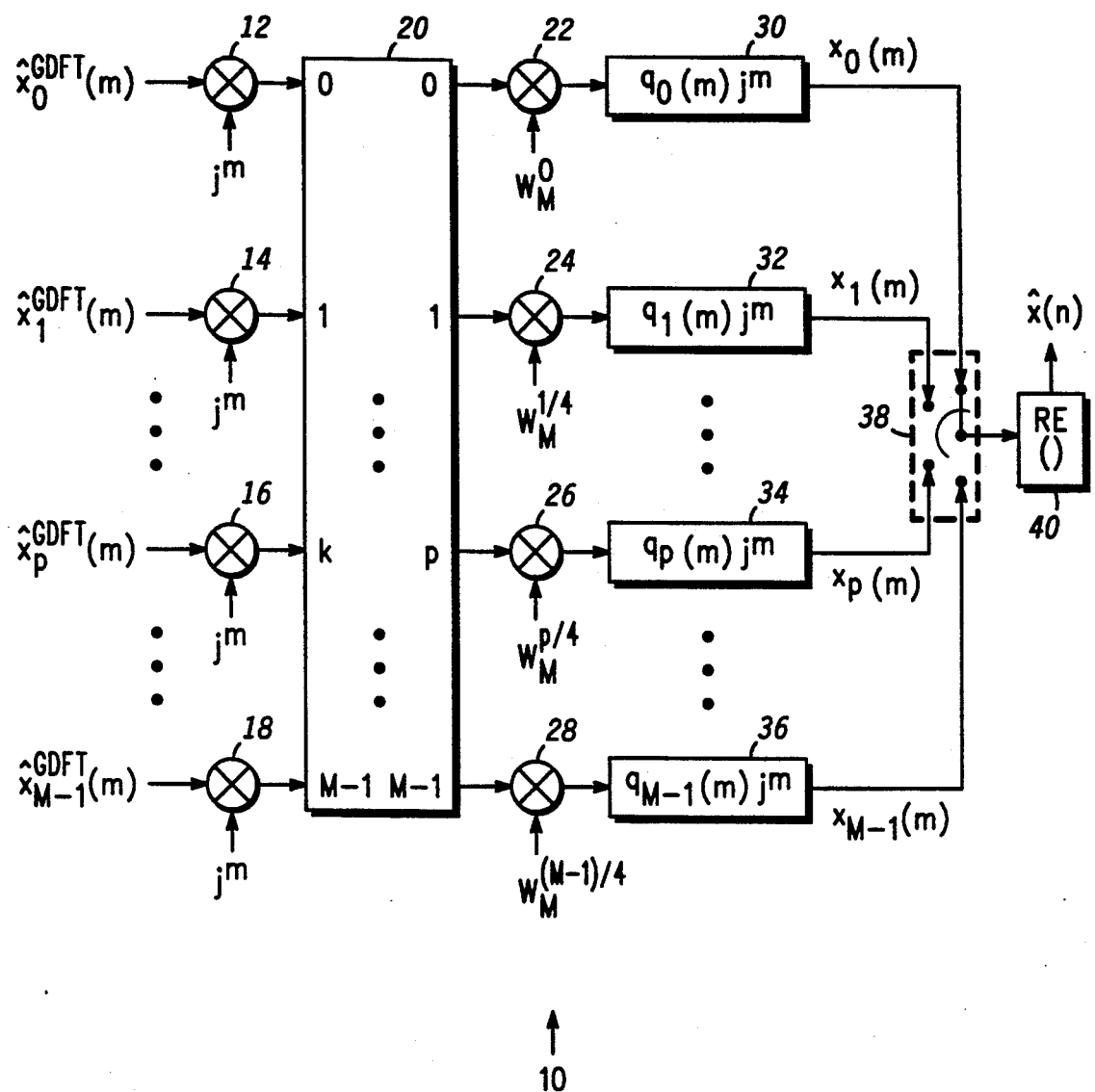
In FIG. 4, there is shown a schematic diagram of a Generalized Discrete Fourier Transform (GDFT) polyphase multiplexer which operates in accordance with a preferred method of the invention.

In FIG. 4, there is shown a schematic diagram of a GDFT polyphase multiplexer 10 which operates in accordance with a preferred method of the invention. The GDFT polyphase multiplexer 10 has the following inputs:

$$\hat{x}_o^{GDFT}(m), \hat{x}_1^{GDFT}(m), \hat{x}_p^{GDFT}(m), \hat{x}_{M-1}^{GDFT}(m)$$

which are input, respectively, into multipliers 12, 14, 16, and 18. The ellipses indicate that only four representatives of the m inputs are shown. In addition, the signal $j^m$ is also input into each of m multipliers (only multipliers 12, 14, 16, and 18 are shown in FIG. 4). The output of each of multipliers 12, 14, 16, and 18 form the 0, 1, k, and m−1 inputs, respectively, of the m inputs for inverse FFT 20. Inverse FFT 20 outputs 0, 1, p, and m−1 correspond to the representative inputs above and are input into multipliers 22, 24, 26, and 28, respectively, along with the respective inputs:

$$W_M^0, W_M^1, W_M^{p/4}, W_M^{(M-1)/4}$$

The output of multipliers 22, 24, 26, and 28 are input into polyphase branch filters (of which polyphase branch filters 30, 32, 34, and 36, respectively, are representatives) providing filtering functions:

$$q_o(m)j^m, q_1(m)j^m, q_p(m)j^m, q_{M-1}(m)j^m$$

respectively. The outputs of polyphase branch filters 30, 32, 34, and 36 produce the respective signals:

$$x_o(m), x_1(m), x_p(m), x_{M-1}(m)$$

The polyphase branch filter outputs are then switched through operator 38, and the real portion of the polyphase branch filter outputs is taken by real function 40. The net result is multiplexed output signal $\hat{x}(n)$.

Figure 5:
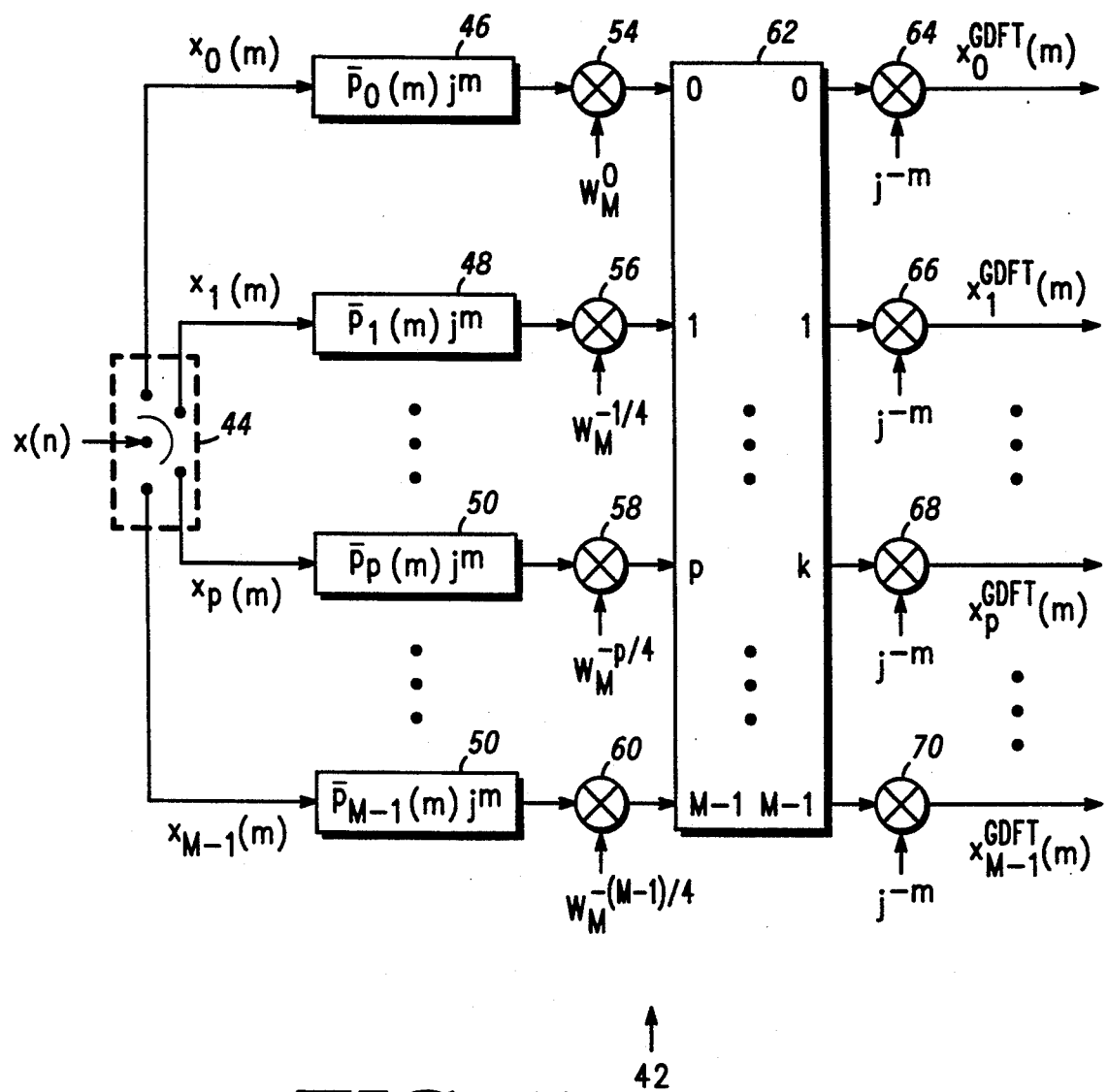
In FIG. 5, there is shown a schematic diagram of a GDFT polyphase demultiplexer which operates in accordance with a preferred method of the invention.

In FIG. 5, there is shown a schematic diagram of a GDFT polyphase demultiplexer 42 which operates in accordance with a preferred method of the invention. The GDFT polyphase demultiplexer 42 receives the multiplexed input signal $x(n)$ into operator 44, which separates the multiplexed input signal $x(n)$ into m inputs. Representative of the m inputs, the inputs $x_o(m)$, $x_1(m)$, $x_p(m)$, and $x_{m-1}(m)$ are shown in FIG. 5 as input, respectively, into polyphase branch filters 46, 48, 50, and 52. Polyphase branch filters 46, 48, 50, and 52 perform the following filtering operations, respectively:

$$\overline{p}_o(m)j^m, \overline{p}_1(m)j^m, \overline{p}_p(m)j^m, \overline{p}_{M-1}(m)j^m$$

The outputs of polyphase branch filters 46, 48, 50, and 52 are input into multipliers 54, 56, 58, and 60, respectively, which also receive the respective inputs:

$$W_M^0, W_M^1, W_M^{-p/4}, W_M^{-(M-1)/4}$$

Multipliers 54, 56, 58, and 60 produce outputs labelled 0, 1, p, and M−1, respectively, into FFT 62. The FFT 62 output signals above are input into multipliers 64, 66, 68, and 70, respectively. Each of multipliers 64, 66, 68, and 70 also receives a $j^{-m}$ input. The output of multipliers 64, 66, 68, and 70 (and the remainder of the multipliers not shown in FIG. 5 which make up the m channels) are signals representing the demultiplexed version of the original input signal labelled 0, 1, k, and M−1, and represent the following signals:

$$x_o^{GDFT}(m), x_1^{GDFT}(m), x_p^{GDFT}(m), x_{M-1}^{GDFT}(m)$$

Thus, a method for FDMA signal multiplexing and demultiplexing has been described which overcomes specific problems and accomplishes certain advantages relative to prior art methods and mechanisms. The improvements over known technology are significant. The channelization scheme modifies and combines the complex and single-sideband approaches to polyphase filter banks to allow the transmission and reception of real signals while manipulating complex baseband signals (I and Q data of a QPSK signal). The polyphase method described reduces the filter computation and storage requirements by a factor M equal to the number of FDMA channels and reduces the frequency translation computation by a factor of $\log_2 M/M$ due to the use of the FFT. The multiplexing and demultiplexing method is conducive to a hardware efficient implementation for generating and separating FDMA signals. Such hardware efficiency is of paramount importance on the IRIDIUM TM satellite cellular communications system.

Thus, there has also been provided, in accordance with an embodiment of the invention, a method for FDMA multiplexing and demultiplexing that fully satisfies the aims and advantages set forth above. While the invention has been described in conjunction with a specific method, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. A method for multiplexing a series of frequency division multiple access (FDMA) signals to produce a multiplexed output signal, the method comprising the steps of:
   providing a plurality of complex channels corresponding to the series of FDMA signals;
   offsetting each of series of FDMA signals relative to each of the plurality of complex channels;
   filtering each of the series of FDMA signals such that each of the series of FDMA signals is centered within and occupies one-half of an available bandwidth in each of the plurality of complex channels, leaving a series of "off" channels such that an "off" channel occurs between each pair of successive FDMA signals in the series of FDMA signals thereby producing said multiplexed output signal; and
   processing a real part of the multiplexed output signal such that a plurality of higher frequency signals of the series FDMA signals image into the series of "off" channels.

2. A method as claimed in claim 1, wherein the step of offsetting comprises the step of offsetting each of the series of FDMA signals by one-fourth of the available bandwidth in each of the plurality of complex channels.

3. A method as claimed in claim 1, wherein the step of providing a plurality of complex channels comprises the step of providing 32 complex channels.

4. A method as claimed in claim 1, wherein the steps of offsetting each of the series of FDMA signals, filtering each of the series of FDMA signals, and processing a real part of the output signal comprise the steps of offsetting, filtering, and processing a 24-channel FDMA signal.

5. A method as claimed in claim 1, wherein the step of filtering each of the series of FDMA signals comprises the steps of integer-band bandpass filtering, aliasing, and imaging.

6. A method as claimed in claim 1, wherein the step of filtering each of the series of FDMA signals comprises the step of filtering using polyphase filtering branches.

7. A method as claimed in claim 1, wherein the step of offsetting each of the series of FDMA signals comprises transforming using a Discrete Fourier Transform (DFM).

8. A method as claimed in claim 2, wherein the step of offsetting each of the series of FDMA signals further comprises transforming using a Generalized Discrete Fourier Transform (GDFT).

9. A method for demultiplexing a multiplexed input signal into a sequence of frequency division multiple access (FDMA) signals, the method comprising the steps of:
   providing a demultiplexing channelization pattern comprising a plurality of complex channels in a complex channel spectrum;
   aligning the multiplexed input signal contained in a plurality of input channels with the demultiplexing channelization pattern, wherein each of the plurality of input channels are one-half a bandwidth of each of the plurality of complex channels and the plurality of input channels contain a sequence of FDMA signals separated by a reverse sequence of images of the FDMA signals;
   overlaying the plurality of input channels onto the plurality of complex channels such that consecutive even-numbered input channels correspond to consecutive complex channels of the plurality of complex channels; and
   extracting the sequence of FDMA signals from the plurality of complex channels.

10. A method as claimed in claim 9, further comprising the step of filtering each of the sequence of FDMA signals such that each of the sequence of FDMA signals is centered within a corresponding input channel.

11. A method as claimed in claim 9, wherein the step of providing a demultiplexing channelization pattern comprising a plurality of complex channels comprises the step of providing each of sequence of FDMA signals offset by one-fourth of the bandwidth of each of the plurality of complex channels.

12. A method as claimed in claim 9, wherein the step of providing a demultiplexing channelization pattern comprising a plurality of complex channels comprises the step of providing 32 complex channels.

13. A method as claimed in claim 9, wherein the step of aligning the multiplexed input signal contained in a plurality of input channels with the demultiplexing channelization pattern comprises the steps of using integer-band bandpass aliasing and imaging.

14. A method as claimed in claim 9, wherein the steps of providing, aligning, overlaying, and extracting comprise the step of transforming using a Discrete Fourier Transform (DFM).

15. A method as claimed in claim 9, wherein the steps of providing, aligning, overlaying, and extracting comprise the step of transforming using a Generalized Discrete Fourier Transform (GDFT).

16. A method for polyphase filtering a plurality of frequency division multiple access (FDMA) signals to produce a multiplexed output signal, the method comprising the steps of:
   providing a plurality of complex channels corresponding to the plurality of FDMA signals;
   offsetting each of the plurality of FDMA signals relative to each of the plurality of complex channels;
   filtering each of the series of FDMA signals such that each of the series of FDMA signals is centered within and occupies one-half of an available bandwidth in each of the plurality of complex channels, leaving a series of "off" channels such that an "off" channel occurs between each pair of successive FDMA signals in the series of FDMA signals thereby producing said multiplexed output signal; and processing a real part of the multiplexed output signal such that a plurality of higher frequency signals of the series of FDMA signals image into the series of "off" channels.

17. A method as claimed in claim 16, wherein the step of offsetting comprises the step of offsetting each of the plurality of FDMA signals by one-fourth of the available bandwidth in each of the plurality of complex channels.

18. A method as claimed in claim 16, wherein the step of providing a plurality of complex channels comprises the step of providing 32 complex channels.

19. A method for polyphase filtering to demultiplex a multiplexed input signal into a sequence of frequency division multiple access (FDMA) signals, the method comprising the steps of:

providing a demultiplexing channelization pattern comprising a plurality of complex channels in a complex channel spectrum;

aligning the multiplexed input signal contained in a plurality of input channels with the demultiplexing channelization pattern, wherein each of the plurality of input channels are one-half a bandwidth of each of the plurality of complex channels and the plurality of input channels contain a sequence of FDMA signals separated by a reverse sequence of images of the FDMA signals;

overlaying the plurality of input channels onto the plurality of complex channels such that consecutive even-numbered input channels correspond to consecutive complex channels of the plurality of complex channels; and extracting the sequence of FDMA signals from the plurality of complex channels.

20. A method as claimed in claim 19, wherein the step of providing a demultiplexing channelization pattern comprising a plurality of complex channels comprises the step of providing each of the plurality of FDMA signals offset by one-fourth of the bandwidth of each of the plurality of complex channels.

* * * * *